United States Patent [19]

Turner

[11] 4,107,624
[45] Aug. 15, 1978

[54] AUTOMATIC FREQUENCY-TRACKING CIRCUIT

[75] Inventor: Paul F. Turner, North Salt Lake, Utah

[73] Assignee: Sperry Rand Corporation, New York, N.Y.

[21] Appl. No.: 816,419

[22] Filed: Jul. 18, 1977

[51] Int. Cl.² .............................................. H03B 3/04
[52] U.S. Cl. ........................................ 331/8; 325/346;
325/423; 329/50; 329/122; 331/10; 331/17;
331/23; 331/25
[58] Field of Search ................... 331/17, 10, 23, 8, 25;
329/50, 122, 124, 125; 325/346, 349, 419, 420, 423

[56] References Cited

U.S. PATENT DOCUMENTS 3,510,779  5/1970  Klapper ............................ 331/17 X
4,053,933  10/1977  Collins ............................. 331/25 X Primary Examiner—Siegfried H. Grimm Attorney, Agent, or Firm—John R. Flanagan; William E. Cleaver; Marshall M. Truex

[57] ABSTRACT

A circuit for receiving an incoming RF signal incurring frequency drift and producing a local signal for tracking the incoming signal includes a phase-locked loop and means incorporated in the loop which compensate or correct for the frequency drift so as to maintain the loop locked on the incoming signal. The loop is defined by a phase detector, a DC amplifier and a voltage controlled oscillator connected in series. The correction means is coupled in parallel with the loop amplifier between the loop detector and amplifier at its one end and between the amplifier and a DC bias voltage supply terminal for the amplifier at its opposite end. The correction means is responsive to low frequency components of a DC voltage produced by the detector for changing, within preset limits, the DC bias voltage applied to the loop amplifier from the supply terminal as offsets in the DC voltage from the detector are caused by frequency drift of the incoming signal so as to maintain operation of the loop amplifier within its optimum bandwidth range.

4 Claims, 2 Drawing Figures

AUTOMATIC FREQUENCY-TRACKING CIRCUIT

The Government has rights in this invention pursuant to Contract No. F33657-75-C-0276 awarded by the Department of the Air Force.

BACKGROUND OF THE INVENTION

1. Field of the Invention

The present invention broadly relates to tracking a wideband, frequency-modulated RF signal and, more particularly, is concerned with an automatic frequency-tracking circuit that employs an improved phase-locked loop incorporating means which compensate for frequency drift in the RF signal so as to maintain the loop locked on the signal.

2. Description of the Prior Art

When an RF carrier signal is frequency modulated (FM), its frequency increases and decreases, above and below the original carrier signal frequency called the center frequency, in accordance with the amplitude variations of a modulating signal. Thus, during the process of frequency modulation, new frequencies, called sideband frequencies, are produced above and below the unmodulated carrier signal's center frequency. The sideband frequencies are multiples of the frequency of the modulating signal. It is these sideband frequencies that contain the signal intelligence and combine with the unmodulated carrier signal to produce the FM signal. The bandwidth of an FM signal is the frequency range between only the extreme upper and extreme lower sideband frequencies whose amplitudes are viewed as significant with respect to intelligence-carrying capacity; however, even these sideband frequencies can extend far from the center frequency of the FM signal. In tracking the frequency of the FM signal for recovery or extraction of the intelligence (i.e., the modulating signal) from the FM signal, devices such as demodulators (or detectors) are utilized. FM demodulators frequently utilize phase-locked loops.

The phase-locked loop basically includes three components: a phase detector, a loop amplifier and a voltage controlled oscillator (VCO). The phase detector receives the FM signal and a local signal generated by the loop VCO, compares their phases and generates a DC voltage which is a measure of the phase difference between the two signals, the phase difference being produced by the difference between the frequencies of the FM signal and the VCO generated signal as well as by inherent loop lag. The DC voltage is filtered and amplified by the loop amplifier and then applied to the VCO so as to drive the signal generated by the VCO in a direction that reduces the phase difference (and thus the frequency difference) between the FM signal and the VCO generated signal. When the loop is "locked," the DC voltage applied to the VCO is such that the frequency of the VCO generated signal is equal to the average frequency of the FM signal, that being, the center frequency of the unmodulated carrier signal portion of the FM signal. The filtered and amplified DC voltage, therefore, represents the intelligence extracted from the FM signal, i.e., the original frequency modulating signal. The modulating signal may be a varying video voltage which is utilized by other circuitry coupled to the FM demodulator to produce a TV picture.

The frequency of an FM signal, as it is being applied to the loop phase detector, will be continually shifting between the upper and lower extreme sidebands of the FM signal while the VCO generated signal, also being applied to the loop phase detector, will try to remain constant, that is, equal to the average frequency of the FM signal, that being the center frequency of the unmodulated carrier signal portion of the FM signal. However, the phase detector will be outputting the phase difference between the signals which is a DC voltage continually moving between positive and negative amplitudes reflecting the continual shifting of the FM signal frequency between its extreme upper and lower sidebands relative to the comparatively constant frequency of the VCO generated signal. The fluctuating DC voltage is amplified and applied to the VCO so as to drive its output signal in a direction which tends to reduce the amplitude of the phase difference output of the phase detector. Thus, the DC voltage applied to the VCO tends to bias it so as to pull it on frequency.

In the case where the FM signal being demodulated by the loop has a very wide bandwidth, called wideband FM, the frequency shifting is so extreme that oftentimes the DC output of the phase detector, which is applied to the loop amplifier to drive the VCO to shift the frequency of its output signal correspondingly, has such wide amplitude swings that the loop amplifier is no longer optimized in its capability to swing positive and negative to follow the input frequency shifts. Consequently, the intelligence begins to distort when the limits of the loop amplifier are exceeded. This is a design limitation of amplifiers known in the current state of the art. As the amplifier's limits are exceeded, it changes from linear operation to nonlinear operation at which time the intelligence represented by its output becomes distorted, i.e., is no longer linearly proportional to the input to the amplifier. Not only is the linearity of the amplified voltage lost when the amplifier's limits are exceeded, but a point is reached where lock of the VCO generated signal on the FM signal is actually broken or lost and the loop VCO begins to skip cycles.

Also, in the case where the average frequency of the FM signal being demodulated drifts off from its center frequency due to, for instance, transmitter drift, the average level of the DC voltage produced by the loop detector will follow the frequency drift. This results in imbalance of the amplifier which decreases its effective range of linear operation. Thus, in the presence of frequency drift of the transmitted signal, the modulation swing of the system must be reduced in order to maintain an undistorted demodulated signal at the receiver end of the system.

SUMMARY OF THE INVENTION

To avoid the above-mentioned problems, the present invention provides means for filtering the low frequency components of the DC offset produced by the phase detector in the loop of the tracking circuit, since a frequency drift is normally a slow drift, and means for integrating the filtered low frequency DC components. The integrator means then corrects for the DC offset rather than the loop amplifier itself correcting the offset so that the loop amplifier can remain optimized in its voltage swing performance capability. The integrator means is the component that follows the frequency drift, not the loop amplifier, and it operates at very low frequencies with very high gain which overrides the response of the loop amplifier to some extent in correcting for the frequency drift.

Therefore, the present invention relates to an automatic frequency-tracking circuit which employs an improved phase-locked loop. Improvement of the loop, which avoids the possibility of the loop amplifier being driven beyond its optimum limits into nonlinear operation in the presence of input frequency drift, is accomplished by the coupling of a low frequency integrator between the loop phase detector and a power supply terminal for the loop amplifier. The integrator will act on the averaged DC output of the phase detector and will correspondingly change, within preset limits, the DC bias voltage applied from the supply terminal to the loop amplifier to maintain linear operation of the latter. In such manner, the necessity of having to make any change in or adjustment to the internal characteristics of the loop amplifier, such as through manual tuning, is avoided.

DETAILED DESCRIPTION OF THE INVENTION

Figure 1:
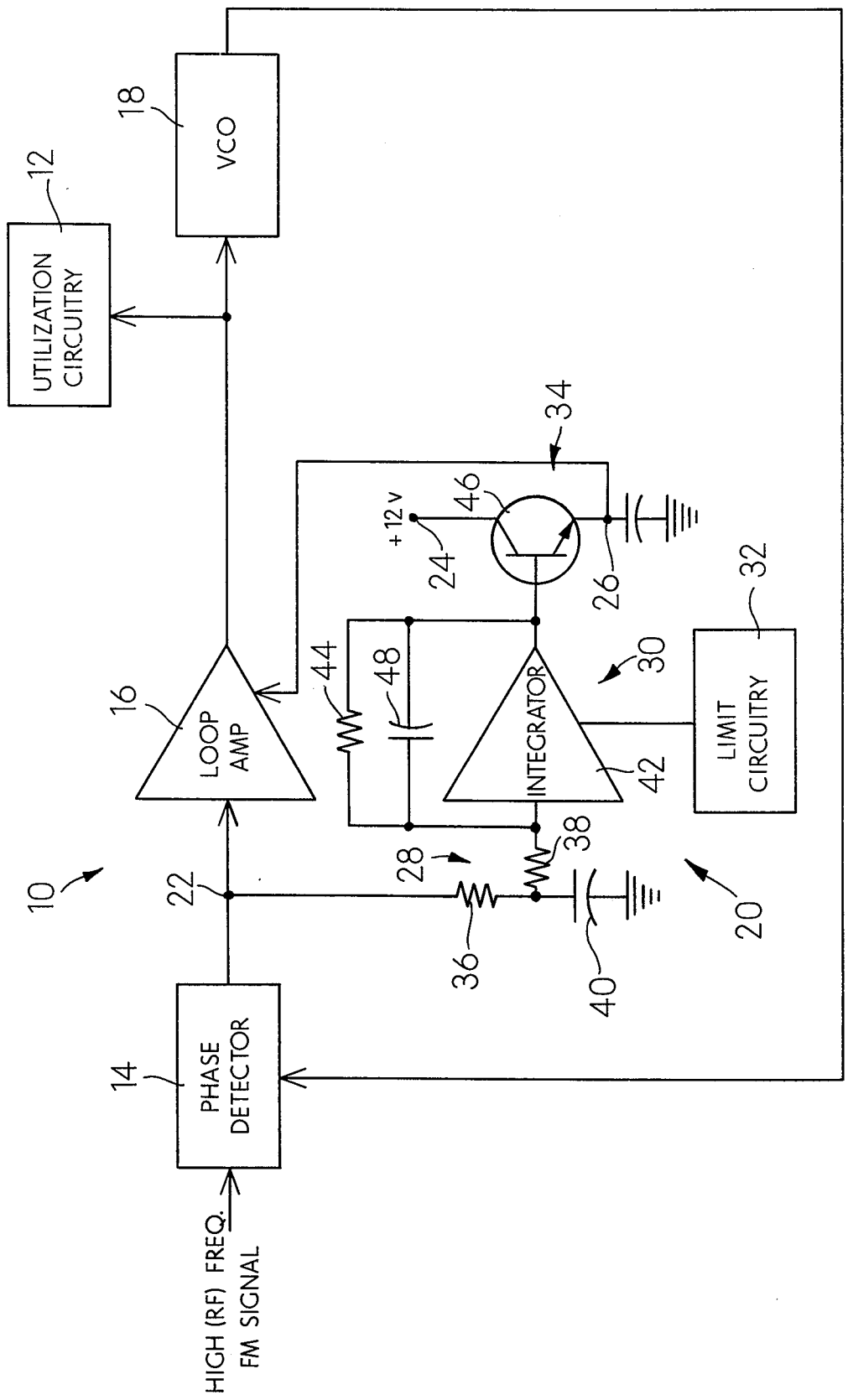
FIG. 1 is a simplified diagram of the automatic frequency-tracking circuit of the present invention.

Referring now to the drawings, and particularly to FIG. 1, there is shown, in simplified form, an automatic frequency-tracking circuit, generally designated 10, comprising the present invention.

The circuit 10 is useful, for example, in an FM receiver or demodulator for detection of the original frequency modulating signal which represents the intelligence that was contained in the FM signal. The modulating signala may be a varying video voltage which may be utilized by other circuitry 12 coupled to the circuit 10 to produce a TV picture.

For recovery of the modulating signal, the circuit 10 employs a conventional phase-locked loop consisting of a mixer or phase comparator or detector 14, a loop amplifier 16 and a voltage controlled oscillator (VCO) 18 connected in series. The mode of operation of a phase-locked loop per se is well known and may be briefly summarized as follows. The phase detector 14 receives the FM signal and a local signal generated by the loop VCO 18, compares their phases and generates a DC voltage which is a measure of the phase difference between the two signals, the phase difference being produced by the difference between the frequencies of the FM signal and the VCO generated signal as well as by inherent loop lag. The DC voltage is filtered and amplified by the loop amplifier 16 and then applied to the VCO 18 so as to drive the signal generated by the VCO 18 in a direction that reduces the phase difference (and thus the frequency difference) between the FM signal and the VCO generated signal. When the loop is "locked," the DC voltage applied to the VCO 18 is such that the frequency of the VCO generated signal is equal to the average frequency of the FM signal, that being, the center frequency of the unmodulated carrier signal portion of the FM signal. The filtered and amplified DC voltage, therefore, represents the intelligence extracted from the FM signal, i.e., the original frequency modulating signal.

The circuit 10 is intended to be utilized for demodulation of wideband FM. In such application, frequency shifting and drifting of the incoming FM signal can be so extreme that oftentimes the DC output of the phase detector 14, which is applied to the loop amplifier 16 to drive the VCO 18 to shift the frequency of its output signal correspondingly, undergoes such wide amplitude swings and offsets that, if it were not for the improvements provided by the present invention, the loop amplifier 16 would no longer be optimized in its capacity to swing positive and negative to follow the wideband FM frequency shifts. Consequently, the intelligence being detected and fed to the utilization circuitry 12 would become distorted.

The improvement provided by the present invention to the above-described conventional phase-locked loop basically relates to the incorporation of compensation or correction means, generally designated 20, being coupled in parallel with the DC loop amplifier 16 of the conventional loop, as shown in FIG. 1, so that the signal produced by the correction means 20 will be summed with that being fed into the loop amplifier 16 in such a way that no inherent signal loss or degradation is incurred by the amplifier 16 as offset in the DC voltage fed to the amplifier 16 from the detector 14 are produced by frequency drift of the incoming FM signal. In such manner, the wideband tracking capability of the loop at the optimum bandwidth of its amplifier 16 is maintained.

More particularly, the correction means 20 is coupled in parallel with the loop amplifier 16 between the detector 14 and amplifier 16 at one end at junction 22 and between the amplifier 16 and a power supply terminal 24 for the amplifier 16 at the opposite end at junction 26. The correction means 20 is responsive to low frequency components of the DC voltage produced by the phase detector 14 for changing, within preset limits, the DC bias voltage applied to the loop amplifier 16 from its power supply terminal as offsets in the detector-produced DC voltage are produced by frequency drift of the incoming FM signal. In such manner, the operation of the loop amplifier 16 within its optimum bandwidth range is maintained by the correction means 20.

Figure 2:
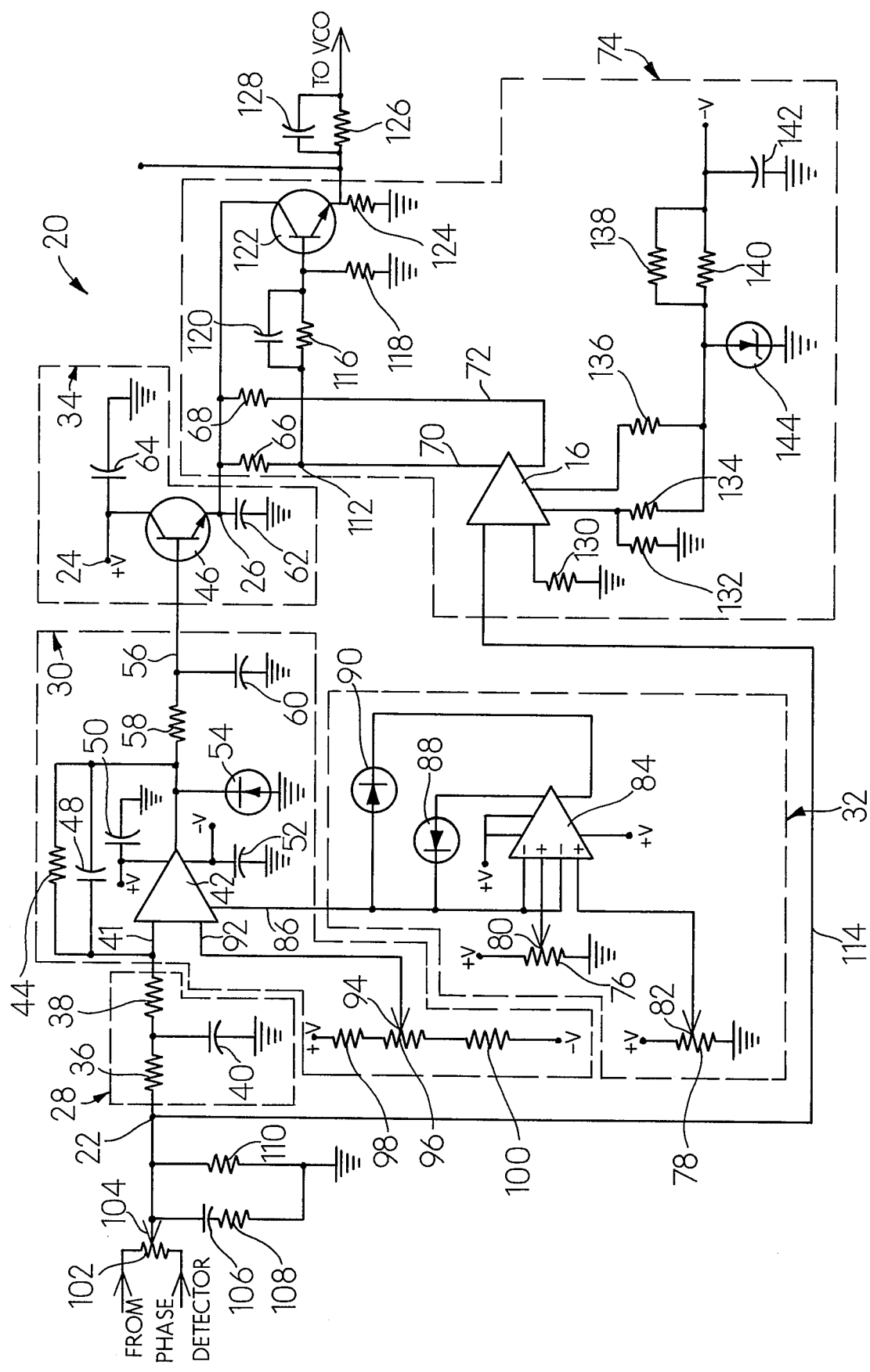
FIG. 2 is a schematic diagram illustrating in detail the improved portion of the circuit of the present invention.

As seen in FIGS. 1 and 2, the basic components of the correction means 20 are a low frequency filter 28, an integrator means 30, limit circuitry 32 and means, generally designated 34, for applying the bias voltage to the loop amplifier 16.

The filter 28, composed of resistors 36, 38 and capacitor 40, essentially averages out all of the frequency fluctuations due to the modulation so that the voltage that is applied on lead line 41 to one of the inputs of the integrator means 30 is a DC component which is representative of the offset or drift of the frequency of the FM signal.

The DC voltage applied to the integrator means 30 through the filter 28 from the phase detector 14 (not shown in FIG. 2) is a very low voltage. The integrator 42 of the means 30, because of the incorporation of resistor 44 in parallel therewith, provides a very high gain such that there is a very large low frequency gain through the integrator 42. Even the slightest amount of frequency drift and corresponding DC voltage offset has a very direct effect, because of this high gain factor, on the loop amplifier 16 when it is summed into the amplifier 16 as a DC bias voltage from the output of an emitter-follower NPN type transistor 46 of the bias voltage applying means 34 being coupled from the output of the integrator 42 to between the bias supply terminal 24 and the junction 26 which is coupled to the collectors of the transistors (not shown) in the loop amplifier 16. The capacitor 48 of the means 30, which is coupled parallel with both the integrator 42 and resistor 44, serves to make sure that the integrator 42 will restore itself once it has been driven to either its upper or lower limit. Capacitors 50 and 52 are merely compensation capacitors that help the low frequency integrator 42 operate properly. The diode 54 coupled between ground and lead line 56 from the output of integrator 42 insures that the voltage output of the integrator 42 never goes negative. It clamps the output so that it will always be positive. This is for protection of the emitter-base junction of the transistor 46. Resistor 58 and capacitor 60 act as a filter for preventing noise from reaching the base of transistor 46. Capacitors 62, 64 have the same kind of purpose, to keep noise from appearing at the emitter of transistor 46 since means 34 is supposed to appear as though it is a power supply for the loop amplifier 16. The emitter of transistor 46, of course, applies the biasing voltage to the loop amplifier 16 through resistors 66, 68 coupled with its transistors' collectors (not shown) by lead lines 70, 72. The resistors 66, 68 are part of the circuitry 74 associated with the loop amplifier 16.

The upper and lower limits of the voltage output from the integrator 42 are established by limit circuitry 32. Such limits, in turn, establish the upper and lower limits of the bias voltage supplied to the loop amplifier 16 from the terminal 24. Resistors 76, 78, depending upon the positions of movable taps 80, 82 therealong which are coupled to two inputs of the limiter 84, establish the upper and lower limits of the voltage that is allowed to be applied on lead line 86 to the control terminal of the integrator 42. The voltage limits are clamped on the control terminal of integrator 42 which, in turn, clamps its output voltage on lead line 56 to between these limits. This clamping action is achieved through the provision of feedback diodes 88, 90 coupled between the output end of limiter 84 and lead line 86. As the voltage at the control terminal of the integrator 42 swings, it will pass through extreme points at which either one of the diodes 88, 90 will turn on and perform a clamping action which prevents the magnitude of the voltage from going beyond the limit established by the respective diode that is turned on.

The other input to the integrator 42 on lead line 92 is connected to a center tap 94 movable along resistor 96 being connected in series between resistors 98, 100 which are respectively connected to positive and negative voltage supply terminals, +V and −V. This input of the integrator 42 allows a threshold level for the integrator 42 to be set, typically very close to ground. The resistor 102 and center tap 104 being coupled to the output of the phase detector 14 (not shown in FIG. 2) serve a purpose similar to that of tap 94 and resistor 96. By adjustment of tap 104 a desired DC balance or match can be set between two diodes (not shown) of the detector 14 respectively connected to opposite ends of the resistor 102, at which setting optimum operation of the loop amplifier 16 can be achieved. The capacitor 106 and one resistor 108 located between the tap 104 and the junction 22 merely serve as compensation components which help to stabilize the loop operation, with the other resistor 110 being a termination resistor to the detector diodes to help terminate the voltage into some impedance connected to ground.

For efficient operation of the loop amplifier 16, it is necessary that the collectors of the two transistors (not shown) within the amplifier 16 being connected to lead lines 70, 72 be balanced during their operation. The amplifier 16 is a differential-type amplifier which is being used as a single output component since the input to the base of the emitter-follower or current buffer transistor 122 is picked off at junction 112 from only one of the dual output ends of the amplifier 16. Thus, by letting the integrator 42, through the bias supply means 34, shift the DC bias level of the differential amplifier collectors through the resistors 66, 68, the DC bias to the loop amplifier 16 is only changed, without any change being made to the internal characteristics of the amplifier itself. The collectors remain balanced as the bias voltage supplied by means 34 swings between the upper and lower limits of the power supply established by the limit circuitry 32. The maintenance of collector balance during the change in the biasing of the collectors between preset limits insures linear operation of the loop amplifier 16 as it is being driven by the DC output of the phase detector 14 of the loop via lead line 114.

The combination of resistors 116,118 and capacitor 120 through which another emitter-follower NPN type transistor 122 is driven improves stability of the circuit 10 and tends to compensate for any stray capacitances that may appear at the base-emitter junction of the transistor 122. The resistors 124, 126 and the capacitor 128 provide compensation for the input capacitance of the VCO 18. The remaining resistors 130, 132, 134, 136, 138, 140 the capacitor 142, zener diode 144 and negative supply, −V, associated with the loop amplifier 16 just establish the normal DC bias states across the collectors of the amplifier tansistors. Also, they help to establish the gain of the amplifier 16.

In connection with the detailed circuit of FIG. 2 which illustrates the improved portion of the loop, one practical example of the values for resistance, capacitance, voltages along with the particular diode, transistor and other component types is as follows:

| Resistors | Ohms |
| --- | --- |
| 36 | 110K |
| 38 | 110K |
| 44 | 22MEG |
| 58 | 1K |
| 66 | 51 |
| 68 | 51 |
| 76 | 5K |
| 78 | 5K |
| 96 | 5K |
| 98 | 30K |
| 100 | 30K |
| 102 | 100 |
| 108 | 24 |
| 110 | 27 |
| 116 | 51 |
| 118 | 1K |
| 124 | 1K |
| 126 | 51 |
| 130 | 10 |
| 132 | 110 |
| 134 | 100 |
| 136 | 62 |
| 138 | 180 |
| 140 | 180 |
| Capacitors | Farads |
| 40 | .01 |
| 48 | 1.5M |
| 50 | .01 |
| 52 | .01 |
| 60 | .01 |
| 62 | .01 |
| 64 | 15M |
| 106 | 4700 |
| 120 | 120P |
| 128 | 680P |
| 142 | 15U |
| Supply | Volts |
| +V | 12 |
| −V | 12 |
| Transistors | |
| 46 | 2N2219 |
| 122 | 2N5109 |
| Diodes | |
| 54, 88, 90 | 1N4148 |

| | -continued |
|---|---|
| 144 | 1N151 (5.1 volts) |
| Limiter | |
| 84 | 747HM |
| Amplifier | |
| 16 | CA3049 |
| Integrator | |
| 42 | 2600 |

Having thus described the invention, what is claimed is:

1. A circuit for receiving an incoming signal incurring frequency drift and producing a local signal for tracking said incoming signal, comprising:

a phase-locked loop being defined by a phase detector, a DC amplifier and a voltage controlled oscillator connected in series, said detector receiving said incoming signal and a local signal generated by said oscillator and producing a DC voltage, said loop oscillator being controlled by said DC voltage produced by said detector and amplified by said amplifier such that said local signal generated by said oscillator locks on said incoming signal;

a terminal coupled to said loop amplifier for supplying a DC bias voltage to said amplifier; and correction means coupled between said detector and said supply terminal for said loop amplifier for receiving said DC voltage from said detector and changing, within preset limits, said DC bias voltage applied to said loop amplifier from said supply terminal as offsets in the DC voltage from said detector are produced by frequency drift of said incoming signal so to maintain operation of said loop amplifier within its optimum bandwidth range, said correction means including a low frequency filter means having an input and an output with said input being coupled to said detector, integrator means having an input and an output with said input being coupled to said output of said filter means for receiving from said filter means the low frequency components of said DC voltage produced by said detector, and means for applying bias voltage from said supply terminal to said loop amplifier and being coupled between said output of said integrator, said supply terminal and said loop amplifier.

2. The circuit as recited in claim 1, wherein said bias voltage applying means is a transistor having its base coupled to said integrator means output, its collector connected to said supply terminal and its emitter coupled to said loop amplifier.

3. The circuit as recited in claim 1, wherein said correction means further includes limit means coupled to said integrator means for establishing upper and lower limits for the output voltage of said integrator means which, in turn, establishes upper and lower limits for the bias voltage supplied from said terminal to said loop amplifier through said applying means.

4. A circuit for receiving an incoming signal incurring frequency drift and producing a local signal for tracking said incoming signal, comprising:

a phase-locked loop being defined by a phase detector, a DC amplifier and a voltage controlled oscillator connected in series, said detector receiving said incoming signal and a local signal generated by said oscillator and producing a DC voltage, said loop oscillator being controlled by said DC voltage produced by said detector and amplified by said amplifier such that said local signal generated by said oscillator locks on said incoming signal; and correction means coupled to said loop in parallel with said loop amplifier and receiving said DC voltage from said detector such that a DC bias voltage produced by said correction means will be summed with that being fed into said amplifier from said detector so as to maintain the optimum amplifier balance for the full operational tuning range of said amplifier even as offsets in the DC voltage fed to said amplifier from said detector are produced by frequency drift of said incoming signal, said correction means including low frequency responsive means coupled to said detector and bias voltage supplying means coupled between said low frequency responsive means and said loop amplifier, said low frequency responsive means for receiving said DC voltage from said detector and, in response to low frequency components thereof, controlling within preset limits the level of said DC bias voltage supplied to said loop amplifier by said supplying means in correspondence with the magnitude of offsets in the DC voltage from said detector as produced by frequency drift of said incoming signal.

* * * * *